(12) United States Patent
Sun et al.

(10) Patent No.: US 8,431,483 B2
(45) Date of Patent: Apr. 30, 2013

(54) METHODS OF FORMING ELECTRICALLY CONDUCTIVE PLUGS AND METHOD OF FORMING RESISTANCE VARIABLE ELEMENTS

(75) Inventors: Zhaoli Sun, Boise, ID (US); Jun Liu, Boise, ID (US); Dapeng Wang, Centerville, VA (US)

(73) Assignee: Micron Technology, Inc., Boise, ID (US)

( * ) Notice: Subject to any disclaimer, the term of this patent is extended or adjusted under 35 U.S.C. 154(b) by 768 days.

(21) Appl. No.: 11/728,492

(22) Filed: Mar. 26, 2007

(65) Prior Publication Data

US 2007/0173060 A1    Jul. 26, 2007

Related U.S. Application Data

(62) Division of application No. 11/127,943, filed on May 11, 2005, now Pat. No. 7,407,885.

(51) Int. Cl.
*H01L 21/44* (2006.01)

(52) U.S. Cl.
USPC ........... 438/652; 438/654; 438/653; 438/687; 257/758

(58) Field of Classification Search .................. 438/626, 438/633
See application file for complete search history.

(56) References Cited

U.S. PATENT DOCUMENTS

| | | | | |
|---|---|---|---|---|
| 5,637,028 A | * | 6/1997 | Haisma et al. | 451/36 |
| 5,641,710 A | * | 6/1997 | Wang et al. | 438/643 |
| 5,780,358 A | * | 7/1998 | Zhou et al. | 438/645 |
| 6,017,821 A | * | 1/2000 | Yang et al. | 438/692 |
| 6,191,029 B1 | * | 2/2001 | Hsiao et al. | 438/633 |
| 6,242,324 B1 | * | 6/2001 | Kub et al. | 438/455 |
| 6,667,228 B2 | * | 12/2003 | Lee et al. | 438/592 |
| 7,008,871 B2 | * | 3/2006 | Andricacos et al. | 438/652 |
| 7,189,626 B2 | | 3/2007 | Elkins et al. | |
| 2002/0127743 A1 | | 9/2002 | Nickel et al. | |
| 2002/0176220 A1 | | 11/2002 | Tang et al. | |
| 2003/0013387 A1 | | 1/2003 | Tsai et al. | |
| 2003/0100178 A1 | | 5/2003 | Kamoshima et al. | |
| 2003/0209728 A1 | | 11/2003 | Kozicki et al. | |
| 2004/0109351 A1 | | 6/2004 | Morimoto et al. | |
| 2004/0224497 A1 | | 11/2004 | Barth | |
| 2006/0024950 A1 | * | 2/2006 | Choi et al. | 438/626 |
| 2006/0094236 A1 | | 5/2006 | Elkins et al. | |

* cited by examiner

*Primary Examiner* — Andy Huynh
*Assistant Examiner* — David Goodwin
(74) *Attorney, Agent, or Firm* — Wells St. John P.S.

(57) ABSTRACT

A method of forming an electrically conductive plug includes providing an opening within electrically insulative material over a node location on a substrate. An electrically conductive material is formed within the opening and elevationally over the insulative material. Some of the conductive material is removed effective to recess an outermost surface of the conductive material to from about 100 Angstroms to about 200 Angstroms from an outermost surface of the insulative material after said removing of some of the conductive material. After removing some of the conductive material, remaining volume of the opening over the conductive material is overfilled with an electrically conductive metal material different from that of the conductive material. The metal material is polished effective to form an electrically conductive plug within the opening comprising the conductive material and the metal material. Other aspects and implementations are contemplated.

24 Claims, 12 Drawing Sheets

METHODS OF FORMING ELECTRICALLY CONDUCTIVE PLUGS AND METHOD OF FORMING RESISTANCE VARIABLE ELEMENTS

RELATED PATENT DATA

This patent resulted from a divisional application of U.S. patent application Ser. No. 11/127,943, filed May 11, 2005 now U.S. Pat. No. 7,407,885, entitled "Methods of Forming Electrically Conductive Plugs and Method of Forming Resistance Variable Elements", naming Zhaoli Sun, Jun Liu and Dapeng Wang as inventors, the disclosure of which is incorporated by reference.

TECHNICAL FIELD

This invention relates to methods of forming electrically conductive plugs, and to methods of forming resistance variable elements.

BACKGROUND OF THE INVENTION

Recently, resistance variable memory elements, which include Programmable Conductive Random Access Memory (PCRAM), have been investigated for suitability as semi-volatile and non-volatile random access memory devices. A typical PCRAM device is disclosed in U.S. Pat. No. 6,348,365 to Moore and Gilton. In typical PCRAM devices, conductive material, such as silver, is incorporated into chalcogenide material. The resistance of the chalcogenide material can be programmed to stable higher resistance and lower resistance states. The unprogrammed PCRAM device is normally in a high resistance state. A write operation programs the PCRAM device to a lower resistance state by applying a voltage potential across the chalcogenide material.

The programmed lower resistance state can remain intact for an indefinite period, typically ranging from hours to weeks, after the voltage potentials are removed. The PCRAM device can be returned to its higher resistance state by applying a reverse voltage potential of about the same order of magnitude as used to write the element to the lower resistance state. Again, the higher resistance state is maintained in a semi-volatile manner once the voltage potential is removed. In this way, such a device can function as a resistance variable memory element having two resistance states, which can define two logic states.

A PCRAM device can incorporate a chalcogenide glass, for example comprising germanium selenide ($Ge_xSe_{100-x}$). The germanium selenide glass may also incorporate silver (Ag) or silver selenide ($Ag_2Se$).

The amorphous nature of the chalcogenide glass material used in a PCRAM device has a direct bearing on its programming characteristics. Thus, the incorporation of silver into the chalcogenide glass requires precise control of the glass composition and silver concentration so as not to cause the chalcogenide glass to change from the desired amorphous state to a crystalline state.

Exemplary preferred resistance variable devices are described in U.S. patent application Ser. No. 10/819,315 filed on Apr. 7, 2004, entitled "Layered Resistance Variable Memory Device and Method of Fabrication", naming Kristy A. Campbell, Jiutao Li, Allen McTeer and John T. Moore as inventors. Certain exemplary preferred embodiments of such application disclose Ag received over GeSe received over $Ag_2Se$ as a composite of some of the switchable resistance variable material received intermediate a pair of electrodes in a memory device. In certain instances, however, it may be desirable to form Ag directly on (with "on" in this document meaning in at least some direct physical touching contact) $Ag_2Se$. The preferred manner of depositing silver in the fabrication of such devices is by sputtering, from a silver target. Unfortunately when sputtering silver directly onto a silver selenide surface, the silver tends to agglomerate providing discontinuous and otherwise less than complete covering of the silver over the $Ag_2Se$, even at deposition thicknesses on the magnitude of 2,000 Angstroms. Such silver agglomeration can cause subsequent processing problems during operation of such a memory cell. Use of a chalcogenide glass layer such as germanium selenide between the silver layer and the silver selenide tends to prevent such undesired silver agglomeration.

A typical resistance variable element comprises a pair of conductive electrodes having the chalcogenide glass material received therebetween. One such manner of forming a first of the conductive electrodes is to provide an elemental tungsten plug within an opening formed in electrically insulative material. The plug is typically formed by overfilling the opening with tungsten, followed by chemically mechanical polishing the tungsten back to at least the outermost surface of the insulative material to form an isolated tungsten plug within the opening. A chalcogenide glass layer is deposited thereover, followed by an outer electrode of the device for example also comprising elemental tungsten. The outer electrode and chalcogenide glass material are typically patterned to form a desired configuration of an individual resistance variable memory element.

Unfortunately, the formation of the typical elemental tungsten metal plug electrode of such devices by chemical mechanical polishing can produce less than optimized devices. For example, in some instances the chemical mechanical polishing typically causes the tungsten plugs to recess relative to an outermost surface of the surrounding insulating material after such polishing from about 40 Angstroms to about 80 Angstroms. Further, the tungsten as-deposited typically has one or both of cracks/crevices and sealed voids (sometimes referred to as "keyholes"). Also, the outermost surface of the tungsten within the openings after the polishing is significantly roughened, for example to a typical roughness of at least 5.0 nanometers RMS roughness. Any one or combination of these artifacts can make it difficult to get complete filling of the remaining volume of the openings with the subsequently deposited chalcogenide glass material of a resistance variable element, leading to less than optimum devices.

While the invention was motivated in addressing the above-identified issues, it is in no way so limited. For example, and by way of example only, the invention has applicability to the fabrication of conductive metal plugs in electrically insulative material, regardless of whether such are incorporated in resistance variable elements. The invention is only limited by the accompanying claims as literally worded, without interpretative or other limiting reference to the specification, and in accordance with the doctrine of equivalents.

SUMMARY

The invention comprises methods of forming electrically conductive plugs, and methods of forming resistance variable elements. In one implementation, a method of forming an electrically conductive plug includes providing an opening within electrically insulative material over a node location on a substrate. An electrically conductive material is formed within the opening and elevationally over the insulative material. Some of the conductive material is removed effective to recess an outermost surface of the conductive material from about 100 Angstroms to about 200 Angstroms from an outermost surface of the insulative material after said removing of some of the conductive material. After removing some of the conductive material, remaining volume of the opening over the conductive material is overfilled with an electrically conductive metal material different from that of the conductive material. The metal material is polished effective to form an electrically conductive plug within the opening comprising the conductive material and the metal material.

In one implementation, a method of forming electrically conductive plugs comprises providing a plurality of openings within electrically insulative material over respective node locations on a substrate. An electrically conductive material is formed within the openings and elevationally over the insulative material. Some of the conductive material is removed effective to recess an outermost surface of the conductive material from an outermost surface of the insulative material after said removing of some of the conductive material. A crevice is received in at least some of the openings after the removing of some of the conductive material. After removing some of the conductive material, remaining volume of the openings over the conductive material is overfilled with an electrically conductive metal material different from that of the conductive material, and effective to fill the crevices. The metal material is polished effective to form electrically conductive plugs within the openings comprising the conductive material and the metal material.

In one implementation, a method of forming an electrically conductive plug comprises providing an opening within electrically insulative material over a node location on a substrate. An electrically conductive material is formed within the opening and elevationally over the insulative material. Some of the conductive material is removed effective to recess an outermost surface of the conductive material from an outermost surface of the insulative material after said removing of some of the conductive material. The conductive material has an outermost surface first roughness within the opening after said removing of some of the conductive material. After removing some of the conductive material, remaining volume of the opening over the conductive material is overfilled with an electrically conductive metal material different from that of the conductive material. The metal material is polished effective to form an electrically conductive plug within the opening comprising the conductive material and the metal material. The electrically conductive plug has an outermost surface second roughness after said metal material-polishing which is less than that of the first roughness.

In one implementation, a method of forming an electrically conductive metal plug comprises providing an opening within insulative material over a node location on a substrate. An elemental metal is provided within the opening and elevationally over the insulative material. The elemental metal is chemically mechanically polished with a first polishing pad force against the substrate effective to recess an outermost surface of the elemental metal from an outermost surface of the insulative material after said elemental metal chemical mechanical polishing. After chemical mechanical polishing the elemental metal, remaining volume of the opening over the polished elemental metal is overfilled with an electrically conductive metal material different from that of the elemental metal, The electrically conductive metal material is chemically mechanically polishes with a second polishing force against the substrate which is less than that of the first polishing pad force effective to form an electrically conductive metal plug within the opening comprising the elemental metal and the electrically conductive metal material.

In certain implementations, the invention includes methods of forming resistance variable elements incorporating any one or combination of the above implementations.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The term "resistance variable memory element" is intended to include any memory element, including Programmable Conductor Random Access Memory (PCRAM) elements which exhibit a resistance change in response to an applied voltage.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

The term "silver" is intended to include not only elemental silver, but also silver with other trace metals or in various alloy combinations with other metals as known in the semiconductor industry, as long as such silver alloy is conductive, and as long as the physical and electrical properties of the silver remain unchanged.

The term "resistance variable material" is intended to include chalcogenide glasses and chalcogenide glasses comprising a metal, such as silver or metal ions. For instance, the term "resistance variable material" may include silver doped chalcogenide glasses, silver-germanium-selenide glasses, chalcogenide glass comprising a silver selenide layer, and non-doped chalcogenide glass, as well as such material incorporating metals in addition to or other than silver and/or germanium.

Figure 1:
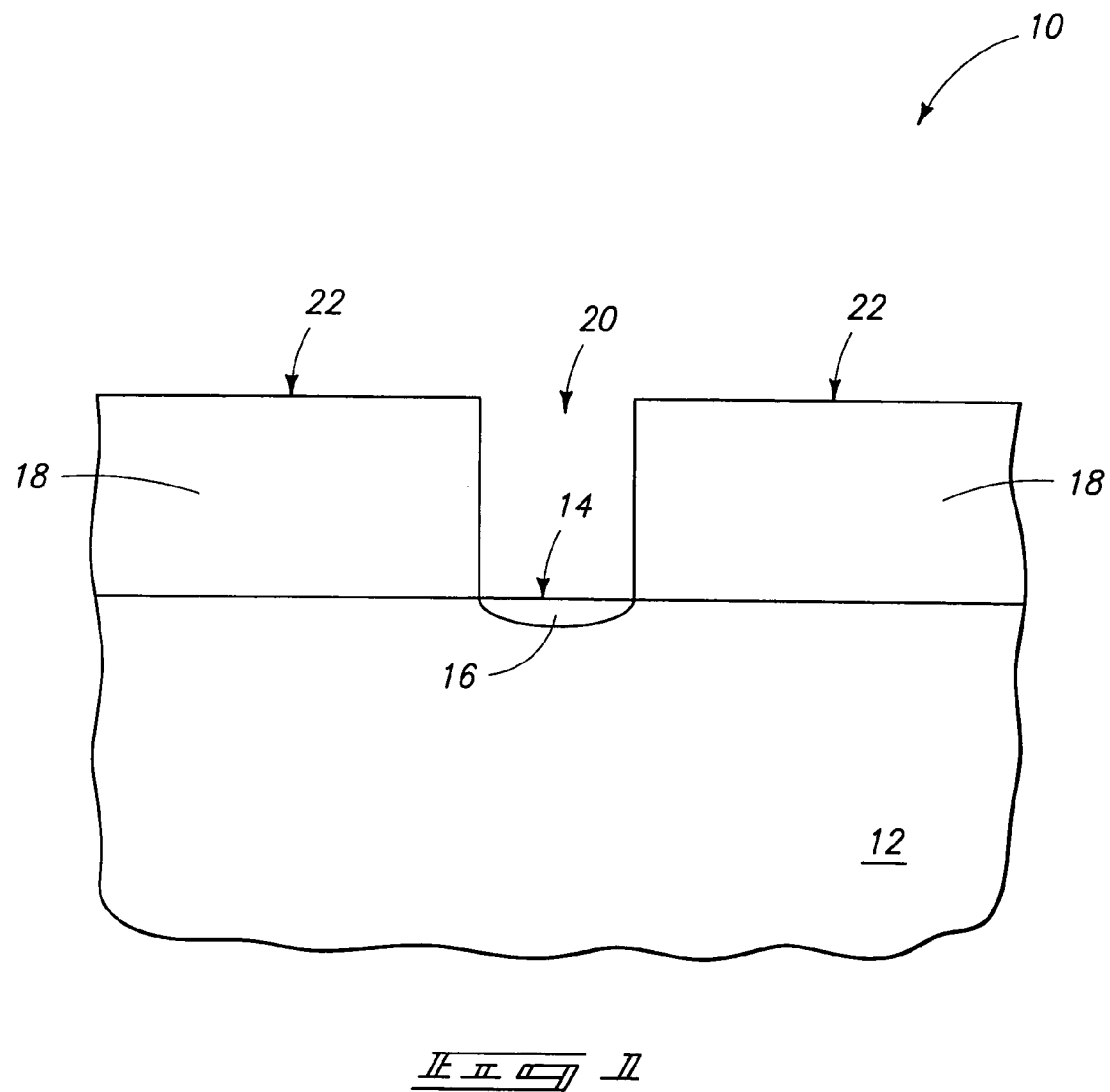
FIG. 1 is a diagrammatic sectional view of a substrate fragment in process in accordance with an aspect of the invention.

Exemplary preferred aspects of the invention and methods of forming electrically conductive metal plugs are initially described with reference to FIGS. 1-5. FIG. 1 depicts a substrate fragment 10, preferably comprising a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 is depicted as comprising a substrate material 12, for example bulk monocrystalline silicon. In the fabrication of an electrically conductive plug, such can be considered as comprising some suitable node location 14 with which electrical contact will be made. In the depicted exemplary embodiment, such comprises a conductive diffusion region 16 of suitable conductivity doping. Any alternate node location 14 is also of course contemplated. For example, and by way of example only, an alternate node location comprises an outermost surface of a conductive pillar received between a pair of transistor gate lines.

An electrically insulative material 18 has been formed over substrate 12, and an opening 20 has been provided therein over node location 14. Exemplary preferred electrically insulative materials 18 include doped and undoped silicon dioxides (i.e., borophosphosilicate glass (BPSG) as a doped example) and silicon nitride, of course including collections of these and other materials. Opening 20 can be provided by any suitable existing or yet-to-be developed manner, with photolithographic processing and etch being but one example. Electrically insulative material 18 can be considered as having an outermost surface 22 which may or may not be planar.

Figure 2:
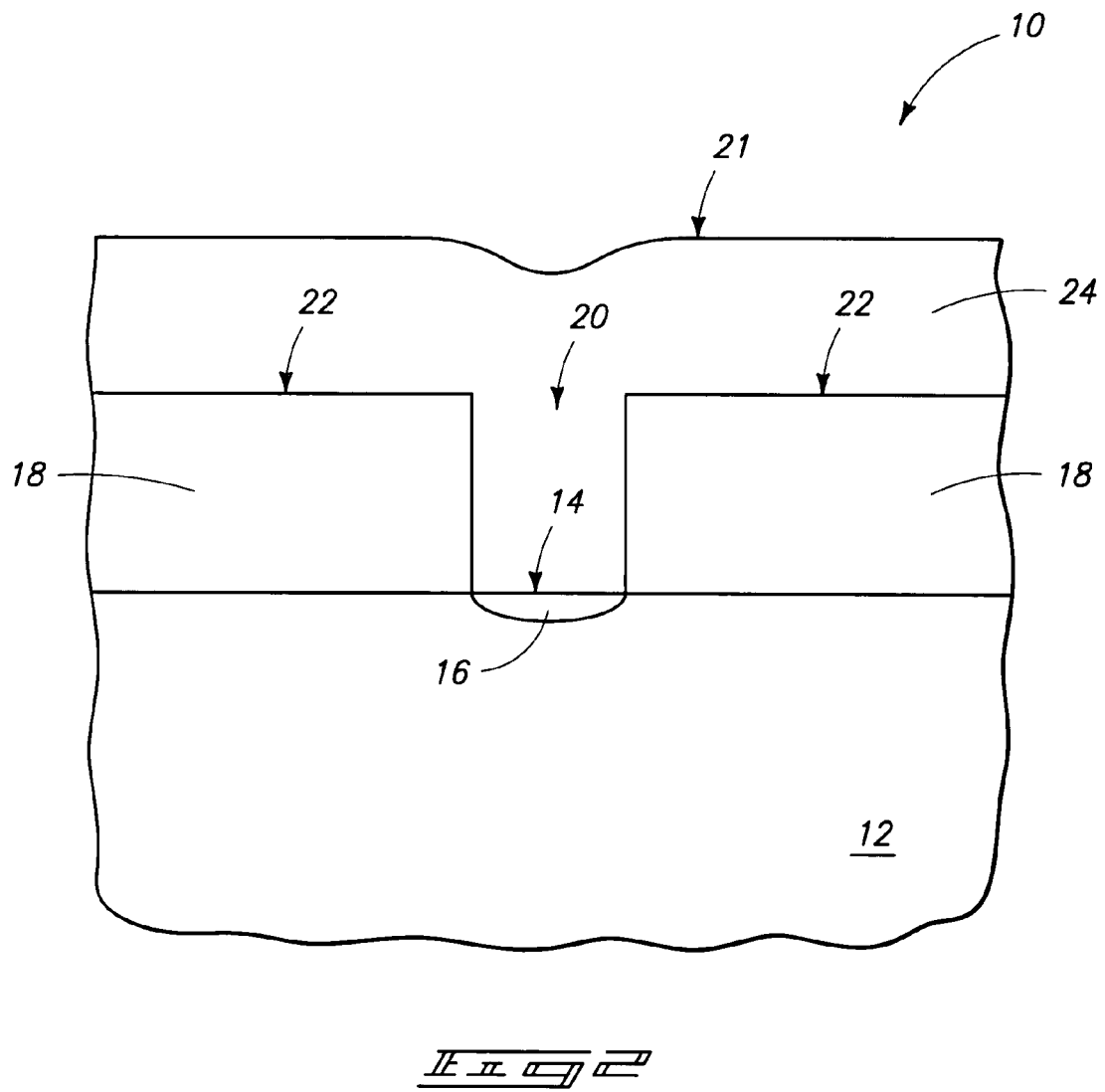
FIG. 2 is a view of the FIG. 1 substrate at a processing step subsequent to that depicted by FIG. 1.

Referring to FIG. 2, a first electrically conductive material 24 is formed within opening 20 and elevationally over insulative material 18. Exemplary preferred materials include elemental-form metals, conductive metal compounds, and conductively doped semiconductive materials (i.e., polysilicon). An exemplary preferred elemental-form material is tungsten. Elemental-form material might comprise an alloy of elemental metals. By way of example only, elemental metal alloys might comprise any combination of two or more elemental metals. Conductive material 24 can be considered as comprising an outermost surface 21.

Figure 3:
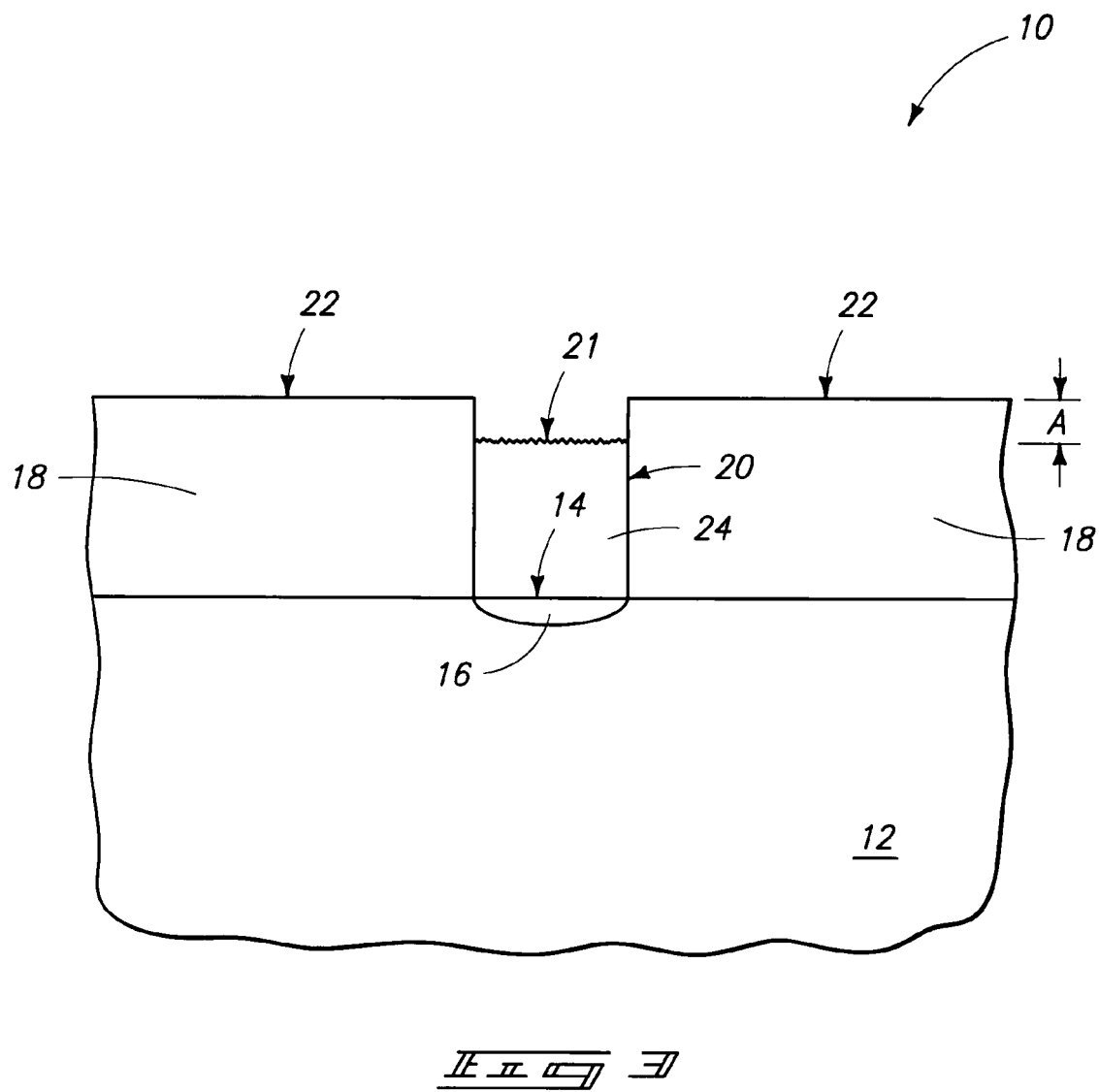
FIG. 3 is a view of the FIG. 2 substrate at a processing step subsequent to that depicted by FIG. 2.

Referring to FIG. 3, some of conductive material 24 has been removed effective to recess outermost surface 21 of conductive material 24 from outermost surface 22 of insulative material 18 after such conductive material-removing. Insulative material outermost surface 22 might also, of course, be removed whereby it moves inwardly relative to/towards the underlying substrate material, such as substrate 12. Exemplary manners of removal include chemical mechanical polishing, chemical etching, resist-etch-back, 100% mechanical polishing, etc. In one exemplary implementation, the removing of some of the conductive material is effective to recess outermost surface 21 thereof to a dimension "A" from about 100 Angstroms to about 200 Angstroms from outermost surface 22 of electrically insulative material 18 after such conductive material-removing. More preferably, dimension "A" is from about 120 Angstroms to about 200 Angstroms, and even more preferably from 155 Angstroms to 165 Angstroms. Regardless, in one exemplary implementation, outermost surface 21 of conductive material 24 has some first roughness within opening 20 after removing of some of the conductive material. In one exemplary embodiment, such first roughness is at least 4 nanometers RMS roughness, and perhaps at least 5 nanometers RMS roughness.

Figure 6:
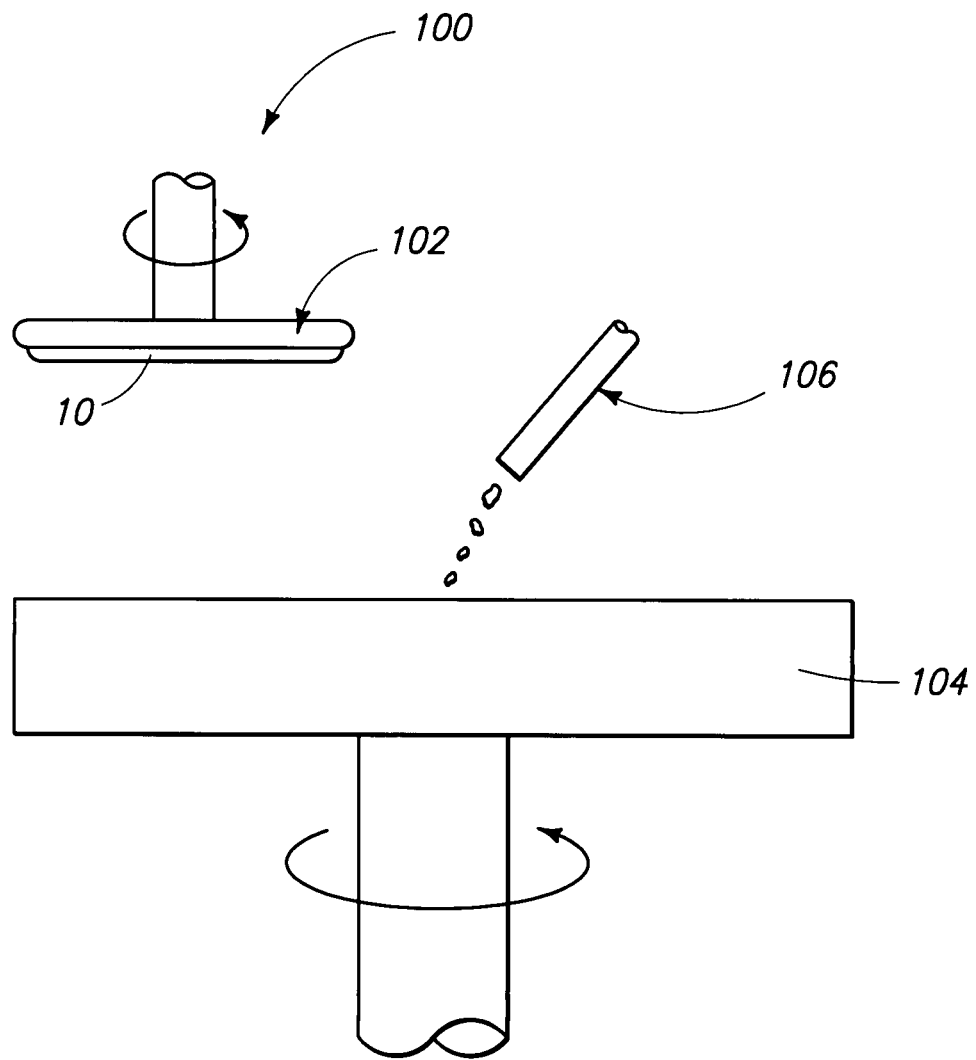
FIG. 6 is a diagrammatic representation chemical mechanical polishing components useable in accordance with aspects of the invention.

The preferred method of removing some of conductive material 24 is chemical mechanical polishing. FIG. 6 diagrammatically, and by way of example only, illustrates a chemical mechanical polishing system 100 comprising a rotatable polishing pad 104 and a rotatable substrate carrier 102. Substrate 10 is depicted as being received by carrier 102. A slurry emitter 106 is diagrammatically depicted for emitting slurry onto pad 104 to be received intermediate the pad and substrate. Of course, the pad and substrate carrier might rotate in the same or different directions.

In one implementation, elemental metal 24 is chemical mechanically polished with a first polishing pad force against substrate 10. An exemplary first polishing force against substrate 10 is at least 3.0 psi, and more preferably at least 3.5 psi. An exemplary polishing slurry comprises $H_2O$, a surfactant, silica, and from about 0.8% to about 1.5% $H_2O_2$ by weight, with 0.9 weight percent being a specific preferred example. An exemplary commercially available slurry comprising a surfactant, water and silica is W2585 available from The Cabot Microelectronics Corporation of Phoenix, Ariz., and to which the preferred $H_2O_2$ is added. An exemplary preferred slurry flow rate range is from 75 mL/minute to 200 mL/minute, with 150 mL/minute being a specific example. An exemplary preferred pad is Model OXP3150 available from Rohm & Haas Electronic Materials of Newark, Del. An exemplary preferred rotational speed for each of the pad and carrier is from about 30 rpm to 90 rpm, more preferably from 50 rpm to 55 rpm for the polishing pad, and from 70 rpm to 75 rpm for the substrate carrier. One specific preferred example (for example for elemental tungsten) is a pad rotation speed of 75 rpm, and a substrate carrier rotation speed of 51 rpm. An exemplary chemical mechanical polishing system is a MIRRA System available from Applied Materials of Santa Clara, Calif. Other systems, slurries, materials and operating parameters are also contemplated.

Figure 4:
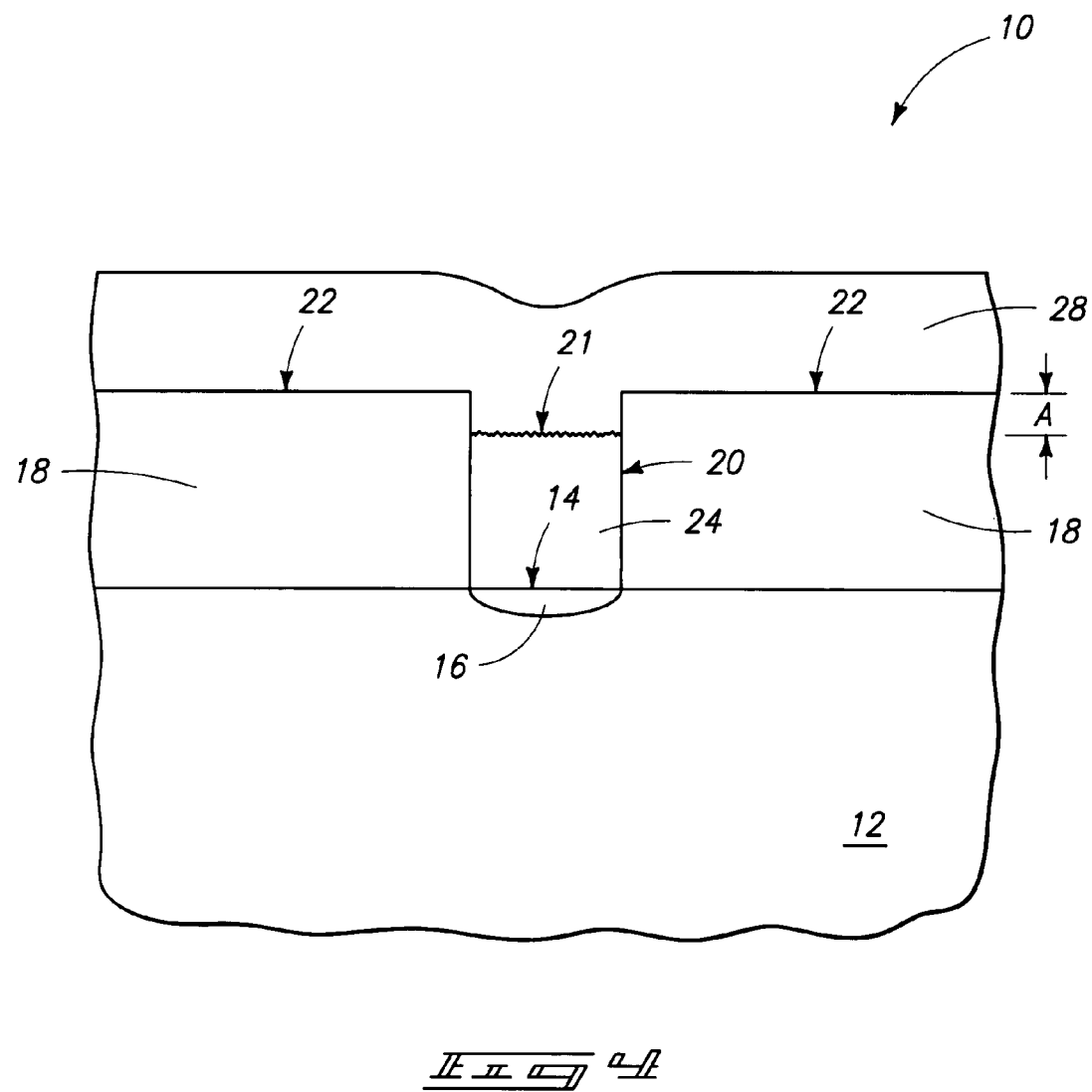
FIG. 4 is a view of the FIG. 3 substrate at a processing step subsequent to that depicted by FIG. 3.

Referring to FIG. 4, and after removing some of conductive material 24, the remaining volume of opening 20 over conductive material 24 is overfilled with a second electrically conductive metal material 28, which is different from that of conductive material 24. In the context of this document, "metal material" encompasses any one or combination of an elemental metal, an alloy of elemental metals, and any conductive metal compound. By way of example only, exemplary electrically conductive metal materials comprise conductive metal nitrides, with TiN and WN being but two examples. Alternate exemplary electrically conductive metal materials might comprise at least one of Cu, Pt, Ti, Ni, Co, Pd, Mo, Zr, Ta, and C in elemental or alloy form. Any other conductive metal material, including conductive metal compounds, is contemplated. The conductive material and the electrically conductive metal material might have or share a common metal element, for example an elemental or alloy tungsten material 24 and tungsten nitride for material 28. Alternately by way of example only, the conductive material and the electrically conductive metal material might not have or share a common element, for example a tungsten material 24 and titanium nitride for material 28.

Figure 5:
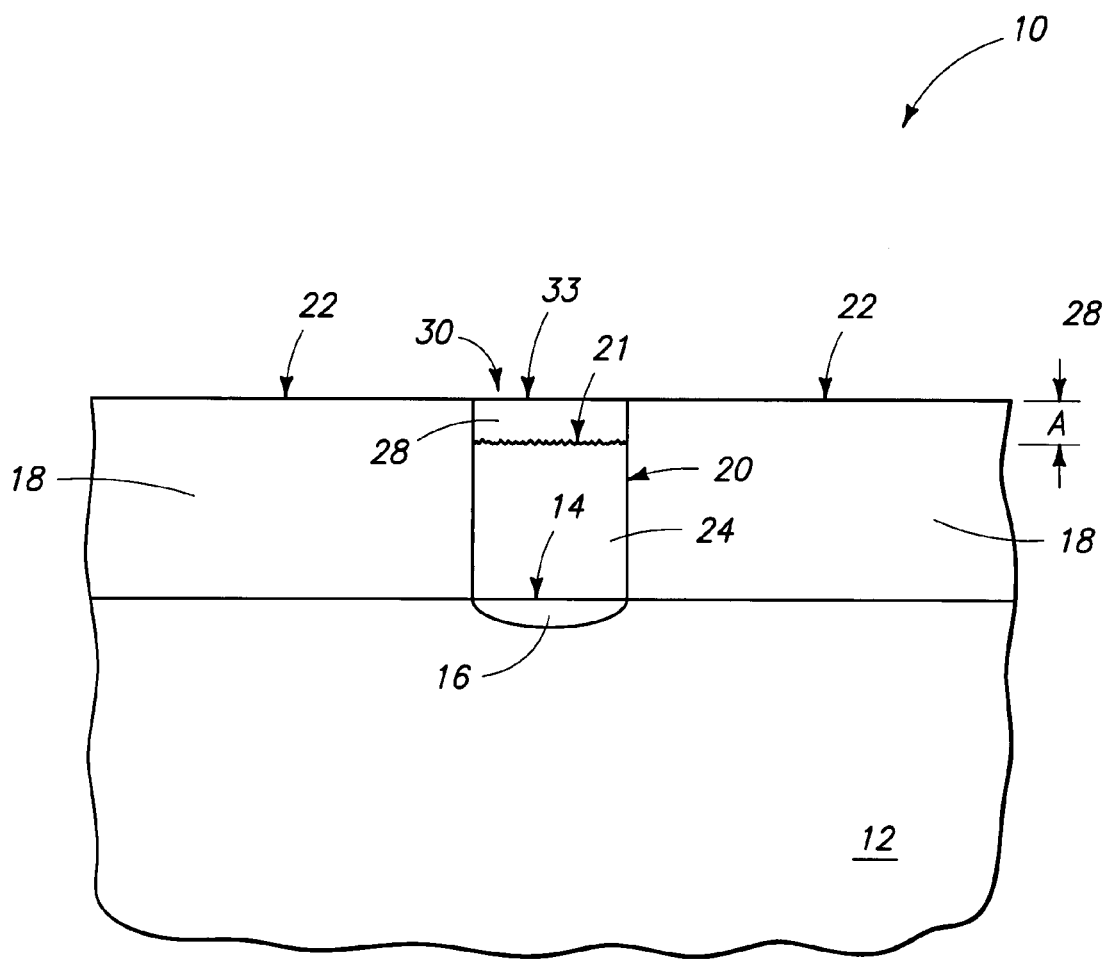
FIG. 5 is a view of the FIG. 4 substrate at a processing step subsequent to that depicted by FIG. 4.

Referring to FIG. 5, electrically conductive metal material 28 has been polished effective to form an electrically conductive plug 30 within opening 20 comprising conductive material 24 and metal material 28. In one implementation, electrically conductive plug 30 has an outermost surface 33 having an outermost surface second roughness after such metal material-polishing which is less than that of the first roughness. In one implementation, the second roughness is no greater than 2 nanometers RMS roughness, and in one implementation the second roughness is no greater than 1 nanometer RMS roughness. Outermost surface 33 might elevationally coincide with outermost surface 22 of electrically insulative material 18, might be recessed relatively thereto, or might be received elevationally outward thereof. Further and regardless, surface 22 might move inwardly by polishing action thereagainst during the polishing of electrically conductive metal material 28.

In one implementation, the manner of polishing material 28 is chemical mechanical polishing, which may use the same or different composition polishing slurry as described above, and which was preferably utilized in the first preferred chemical mechanical polishing. In one preferred implementation, the chemical mechanical polishing of electrically conductive metal material 28 is conducted with a second polishing force against substrate 10 which is less than that of the first polishing pad force. In one example, the second polishing force against the substrate is from 1.0 psi to 2.0 psi, with an exemplary preferred narrower range being from 1.4 psi to 1.6 psi. Other parameters and materials are otherwise preferably as described above with the first embodiment preferred chemical mechanical polishing.

Figure 7:
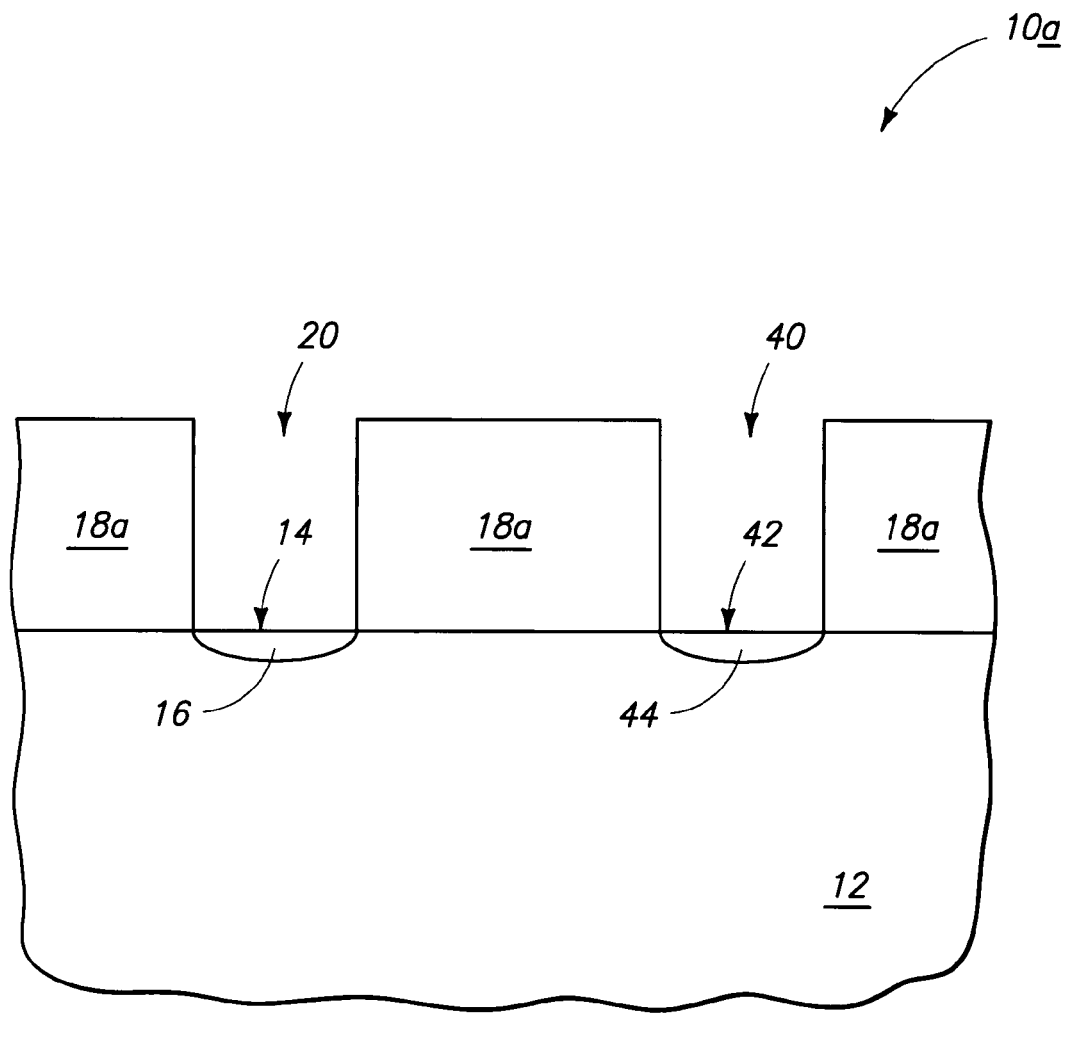
FIG. 7 is a diagrammatic sectional view of an alternate embodiment substrate fragment in process in accordance with an aspect of the invention.

The invention also, of course, contemplates methods of forming a plurality of electrically conductive plugs. For example, and by way of example only, such is described in a preferred exemplary embodiment with respect to FIGS. 7-11 with respect to a substrate fragment 10a. Like numerals from the first-described embodiment have been utilized where appropriate, with differences being indicated with the suffix "a", or with different numerals. FIG. 7 depicts providing a plurality of openings 20 and 40 within insulative material 18a over respective node locations 14 and 42 on a substrate 12. Node location 42 is depicted as comprising a conductive diffusion region 44 within material 12, like the first embodiment, with materials of composition and methods of processing otherwise being preferably as described above. Other node locations are of course contemplated, for example as described above.

Figure 8:
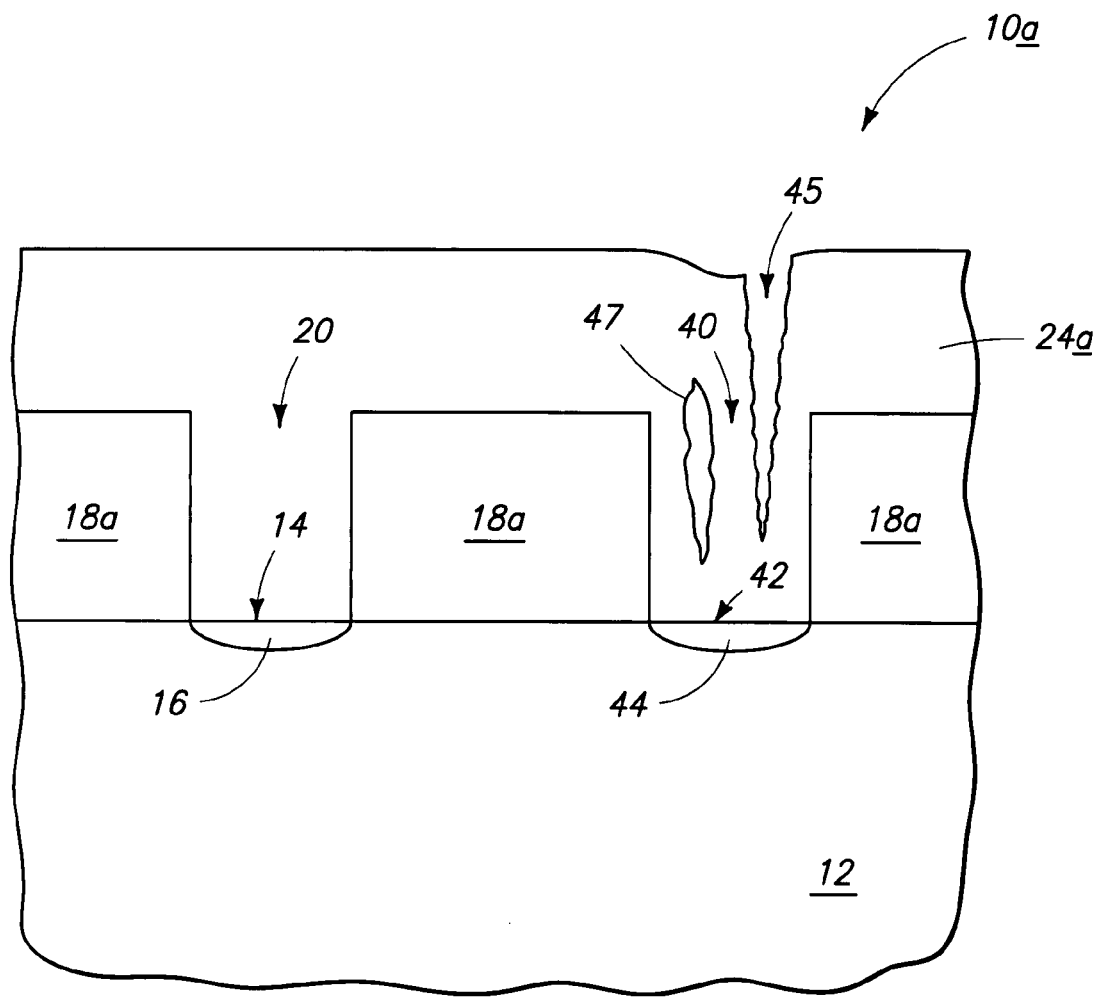
FIG. 8 is a view of the FIG. 7 substrate at a processing step subsequent to that depicted by FIG. 7.

Referring to FIG. 8, electrically conductive material 24a has been formed within openings 20 and 40, and elevationally over material 18a. A crevice 45 and a sealed void 47 are depicted as being received within opening 40 within conductive material 24a. An exemplary such crevice and void might also form in the above-described first embodiment. Further and regardless, only a single of such crevice and sealed void might form within the conductive material with respect to an individual opening in material 18/18a. Materials and processing for the formation of conductive material 24a are otherwise preferably as described above in the first embodiment with respect to material 24.

Figure 9:
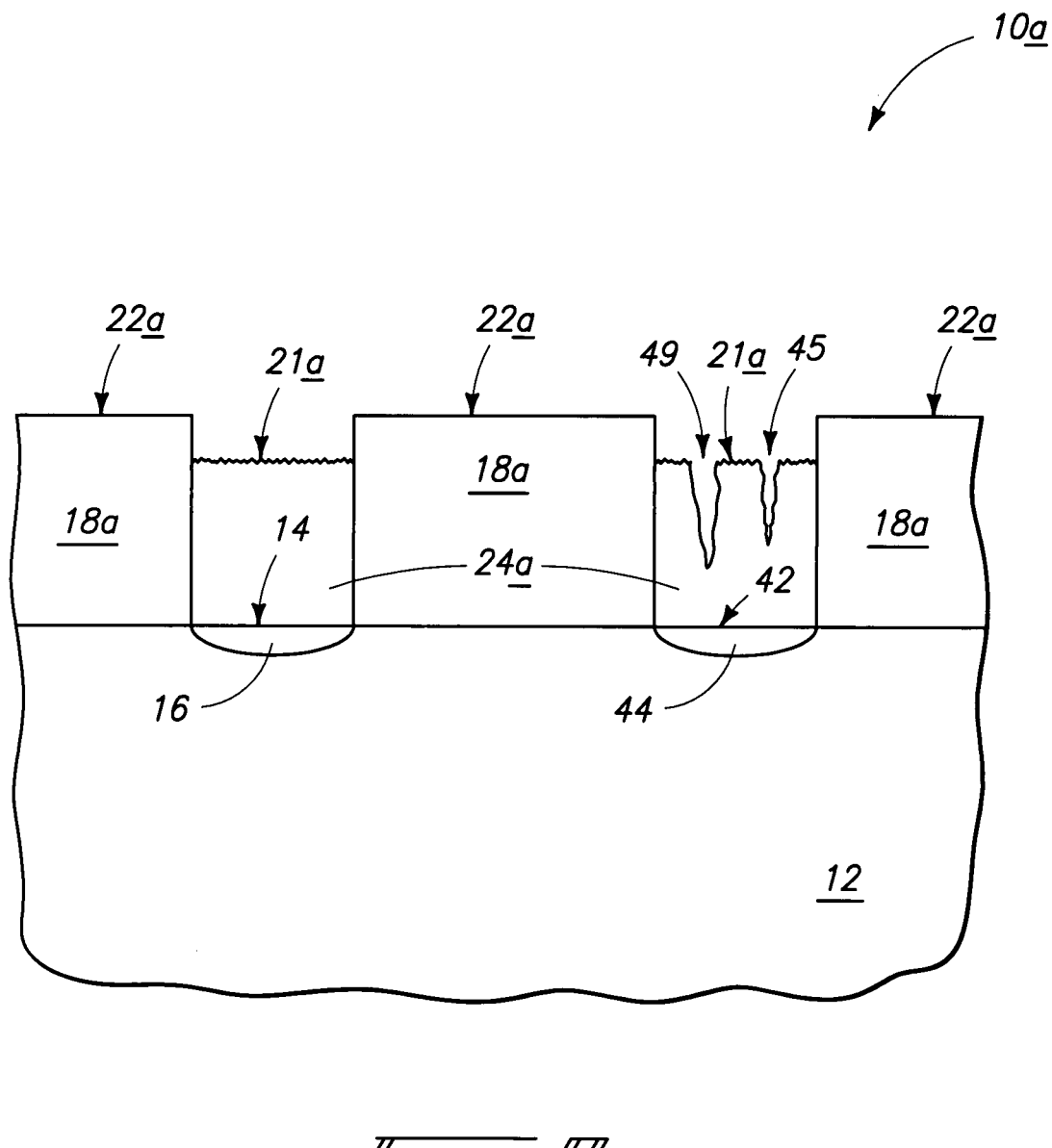
FIG. 9 is a view of the FIG. 8 substrate at a processing step subsequent to that depicted by FIG. 8.

Referring to FIG. 9, some of conductive material 24a has been removed effective to recess an outermost surface 21a of conductive material 24a from an outermost surface 22a of insulative material 18a after such conductive material-removing. Crevice 45 is received in at least some the openings after removing some of the elemental metal 24a, and sealed opening 47 has become a crevice 49. In the depicted exemplary described embodiment, crevice 45 typically forms upon the deposition of material 24a. However in one aspect, the invention envisions the provision of a crevice 45 within at least some of the openings independent of whether such is formed in the initially deposited material or by subsequent processing, including for example by the polishing or other partial removal thereof. Other processing and attributes are otherwise typically and preferably as described above. In one implementation, after such removing, individual crevices 45 and 49 have respective maximum open widths which are less than 50% of a minimum width of the respective opening in which the crevice is received, more preferably less than 33%, and even more preferably less than 25%.

Figure 10:
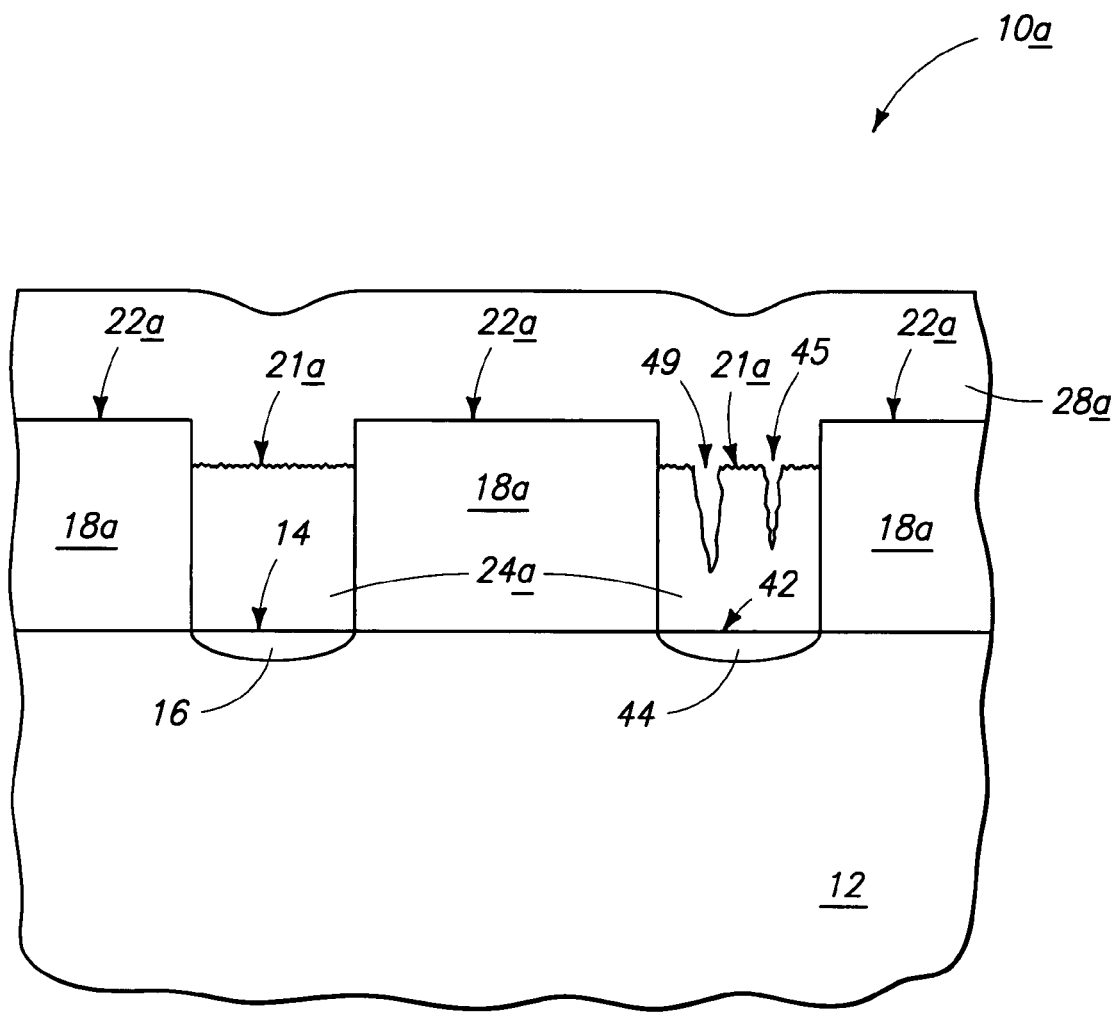
FIG. 10 is a view of the FIG. 9 substrate at a processing step subsequent to that depicted by FIG. 9.

Referring to FIG. 10 and after removing some of conductive material 24a, the remaining volume of the openings over conductive material 24a is overfilled with an electrically conductive metal material 28a which is different from that of conductive material 24a, and effective to fill crevices 45 and 49. Preferred and exemplary materials 28a are the same as those described above for material 28 in the above-described embodiments.

Figure 11:
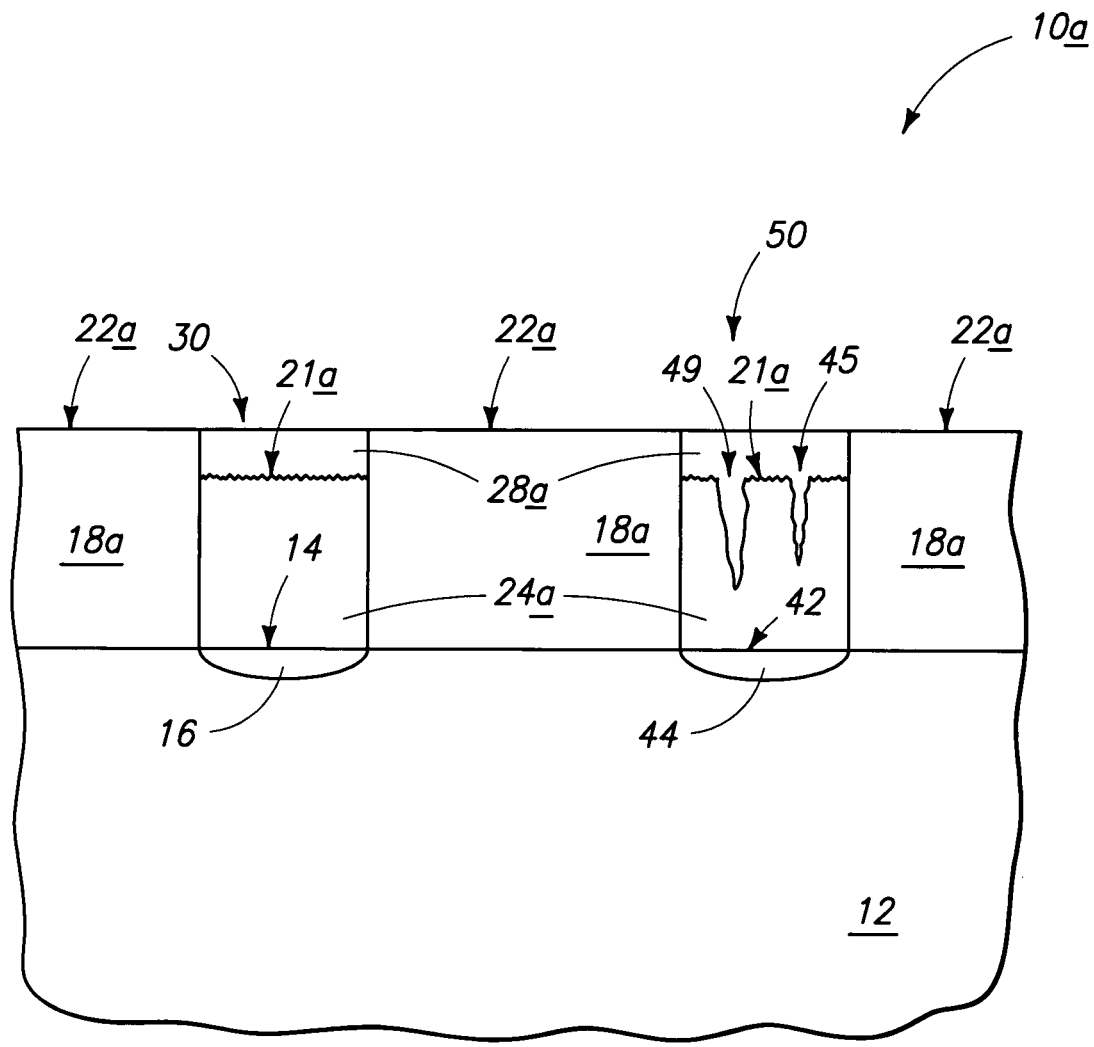
FIG. 11 is a view of the FIG. 10 substrate at a processing step subsequent to that depicted by FIG. 10.

Referring to FIG. 11, electrically conductive metal material 28a has been polished effective to form electrically conductive plugs 30 and 50 within openings 20 and 40, respectively, comprising conductive material 24a and electrically conductive metal material 28a. Preferred and exemplary manners of polishing are preferably as described above in the first-described embodiment.

Figure 12:
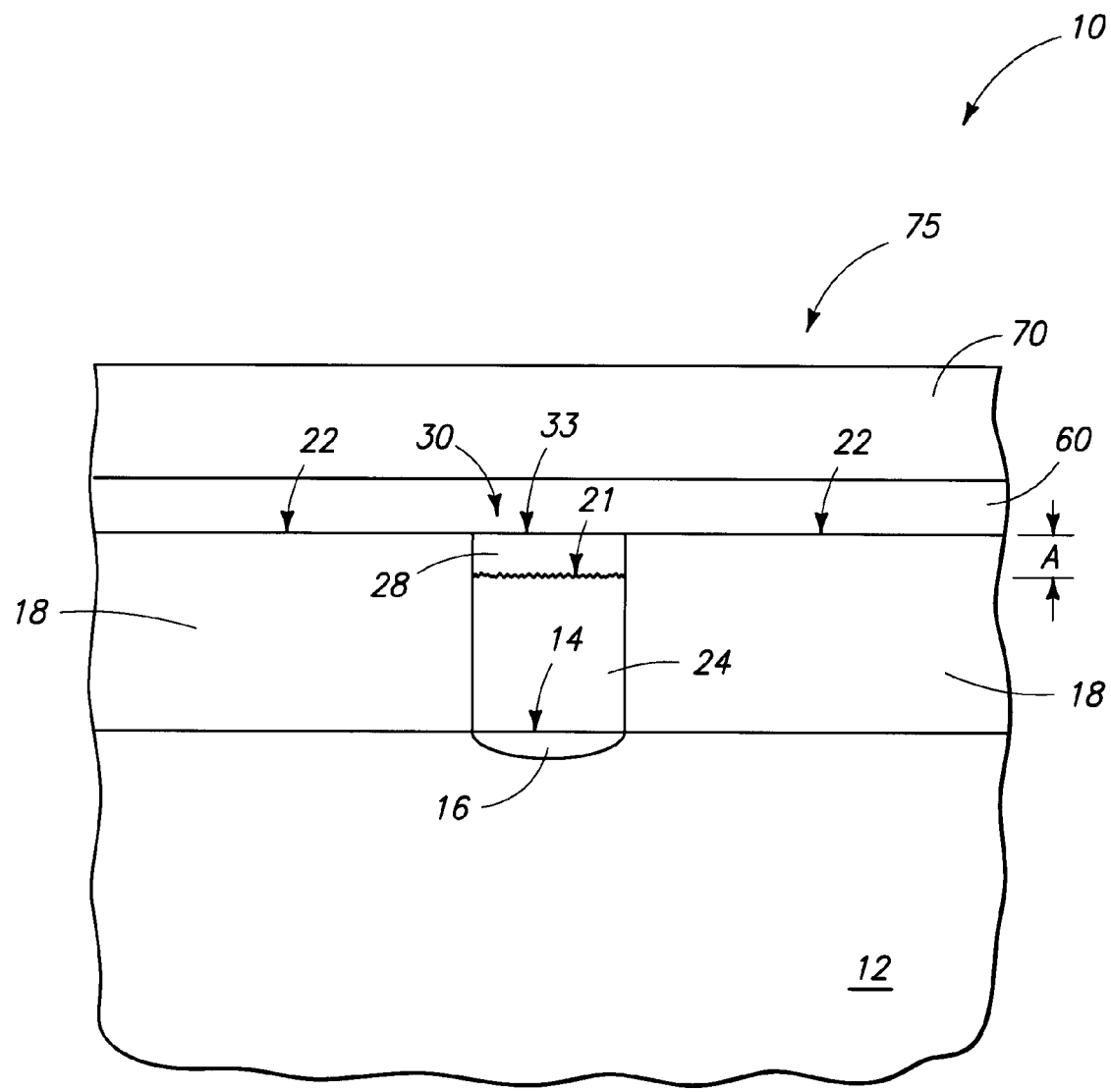
FIG. 12 is a view of the FIG. 5 substrate at a processing step subsequent to that depicted by FIG. 5.

Aspects of the invention also encompass methods of forming a resistance variable element utilizing any one or combination of the above-described techniques and attributes. For example, FIG. 12 depicts electrically conductive plug 30 as comprising a first electrode of a resistance variable element 75. A chalcogenide glass material 60 has been formed over conductive material plug-comprising first electrode 30, and a second electrode 70 has been formed over chalcogenide glass material 60 to form resistance variable element 75. Exemplary materials 60 and 70, by way of example only, are as described above in the background section.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of alleviating defects while forming an electrically conductive plug, comprising:

providing an opening within electrically insulative material over a node location on a substrate;

forming a single electrically conductive material to overfill the opening and elevationally over the insulative material, the electrically conductive material physically contacting the electrically insulative material within the opening;

removing some of the conductive material effective to recess an outermost surface of the conductive material from an outermost surface of the insulative material after said removing of some of the conductive material, the conductive material having an outermost surface first roughness within the opening after said removing of some of the conductive material;

after removing some of the conductive material, overfilling remaining volume of the opening over the conductive material with a single electrically conductive metal material different from that of the conductive material; and polishing the metal material effective to form an electrically conductive plug within the opening comprising the conductive material and the metal material, the electrically conductive plug having an outermost surface second roughness after said metal material-polishing which is less than that of the first roughness; the method alleviating roughness defects in the electrically conductive plug.

2. A method of alleviating defects while forming an electrically conductive plug, comprising:

providing an opening within electrically insulative material over a node location on a substrate;

forming a single electrically conductive material to overfill the opening and elevationally over the insulative material, the electrically conductive material physically contacting the electrically insulative material within the opening;

removing some of the conductive material effective to recess an outermost surface of the conductive material from an outermost surface of the insulative material after said removing of some of the conductive material, the conductive material having an outermost surface first roughness of at least 4 nanometers RMS roughness within the opening after said removing of some of the conductive material;

after removing some of the conductive material, overfilling remaining volume of the opening over the conductive material with a single electrically conductive metal material different from that of the conductive material; and polishing the metal material effective to form an electrically conductive plug within the opening comprising the conductive material and the metal material, the electrically conductive plug having an outermost surface second roughness after said metal material-polishing which is less than that of the first roughness and which is no greater than 2 nanometers RMS roughness; the method alleviating roughness defects in the electrically conductive plug.

3. The method of claim 2 wherein the first roughness is at least 5 nanometers RMS roughness, and the second roughness is no greater than 1 nanometer RMS roughness.

4. A method of alleviating defects while forming an electrically conductive plug, comprising:

providing an opening within electrically insulative material over a node location on a substrate;

forming a single electrically conductive material within the opening and elevationally over the insulative material, the electrically conductive material physically contacting the electrically insulative material within the opening;

removing some of the conductive material effective to recess an outermost surface of the conductive material to from about 100 Angstroms to about 200 Angstroms from an outermost surface of the insulative material after said removing of some of the conductive material, the conductive material having an outermost surface first roughness within the opening after said removing of some of the conductive material;

after removing some of the conductive material, overfilling remaining volume of the opening over the conductive material with a single electrically conductive metal material different from that of the conductive material; and polishing the metal material effective to form an electrically conductive plug within the opening comprising the conductive material and the metal material, the electrically conductive plug having an outermost surface second roughness after said metal material-polishing which is less than that of the first roughness; the method alleviating roughness defects in the electrically conductive plug.

5. The method of claim 4 wherein removing some of the conductive material is effective to recess the outermost surface of the conductive material to from 120 Angstroms to about 200 Angstroms from the outermost surface of the insulative material after said removing of some of the conductive material.

6. The method of claim 4 wherein removing some of the conductive material is effective to recess the outermost surface of the conductive material to from 155 Angstroms to about 165 Angstroms from the outermost surface of the insulative material after said removing of some of the conductive material.

7. The method of claim 1 wherein the conductive material comprises metal in elemental form.

8. The method of claim 7 wherein the elemental metal comprises tungsten.

9. The method of claim 1 wherein the conductive material comprises a conductive metal compound.

10. The method of claim 1 wherein the conductive material comprises conductively doped semiconductive material.

11. A method of forming an electrically conductive plug, comprising:

providing an opening within electrically insulative material over a node location on a substrate;

forming a single electrically conductive material within the opening and elevationally over the insulative material, the electrically conductive material physically contacting the electrically insulative material within the opening;

removing some of the conductive material by chemical mechanical polishing effective to recess an outermost surface of the conductive material from an outermost surface of the insulative material after said removing of some of the conductive material, the conductive material having an outermost surface first roughness within the opening after said removing of some of the conductive material;

after removing some of the conductive material, overfilling remaining volume of the opening over the conductive material with an electrically conductive metal material different from that of the conductive material; and chemical mechanical polishing the metal material effective to form an electrically conductive plug within the opening comprising the conductive material and the metal material, the electrically conductive plug having an outermost surface second roughness after said metal material-polishing which is less than that of the first roughness.

12. The method of claim 11 wherein said chemical mechanical polishings use the same composition polishing slurry.

13. The method of claim 1 wherein the metal material comprises a metal nitride.

14. The method of claim 13 wherein the metal nitride comprises at least one of TiN and WN.

15. The method of claim 14 wherein the conductive material comprises elemental tungsten.

16. A method of forming an electrically conductive plug, comprising:

providing an opening within electrically insulative material over a node location on a substrate;

forming a single electrically conductive material within the opening and elevationally over the insulative material, the electrically conductive material physically contacting the electrically insulative material within the opening;

removing some of the conductive material effective to recess an outermost surface of the conductive material from an outermost surface of the insulative material after said removing of some of the conductive material, the conductive material having an outermost surface first roughness within the opening after said removing of some of the conductive material;

after removing some of the conductive material, overfilling remaining volume of the opening over the conductive material with a single electrically conductive metal material different from that of the conductive material, the conductive material within the opening comprising a crevice after said removing some of the conductive material, the metal material filling the crevice; and polishing the metal material effective to form an electrically conductive plug within the opening comprising the conductive material and the metal material, the electrically conductive plug having an outermost surface second roughness after said metal material-polishing which is less than that of the first roughness; the method alleviating roughness defects and crevice defects in the electrically conductive plug.

17. The method of claim 1 wherein the conductive material comprises at least one of Cu, Pt, Ti, Ni, Co, Pd, Mo, Zr, Ta, and C in elemental or alloy form.

18. The method of claim 16 wherein the crevice has a maximum open width which is less than 50% of a minimum width of the opening in which the crevice is received.

19. The method of claim 16 wherein the crevice has a maximum open width which is less than 33% of a minimum width of the opening in which the crevice is received.

20. The method of claim 16 wherein the crevice has a maximum open width which is less than 25% of a minimum width of the opening in which the crevice is received.

21. The method of claim 16 wherein the conductive material comprises metal in elemental form.

22. The method of claim 16 wherein the conductive material comprises a conductive metal compound.

23. The method of claim 16 wherein the conductive material comprises conductively doped semiconductive material.

24. The method of claim 16 wherein removing some of the conductive material is effective to recess the outermost surface of the conductive material to from 120 Angstroms to about 200 Angstroms from the outermost surface of the insulative material after said removing of some of the conductive material.

* * * * *

UNITED STATES PATENT AND TRADEMARK OFFICE
CERTIFICATE OF CORRECTION

PATENT NO. : 8,431,483 B2
APPLICATION NO. : 11/728492
DATED : April 30, 2013
INVENTOR(S) : Zhaoli Sun et al.

Page 1 of 1

It is certified that error appears in the above-identified patent and that said Letters Patent is hereby corrected as shown below:

On Title Page, Item (75), under "Inventors", column 1, line 3, delete "Centerville," and insert -- Centreville, --, therefor.

Signed and Sealed this
Twenty-fifth Day of June, 2013

Teresa Stanek Rea
*Acting Director of the United States Patent and Trademark Office*